United States Patent
Windover

(10) Patent No.: US 6,973,105 B2
(45) Date of Patent: Dec. 6, 2005

(54) METHOD AND APPARATUS TO ENABLE ADAPTIVE EQUALIZATION AT HIGH BANDWIDTHS WHEN USING SINGLE-MODE VCSELS OVER MULTIMODE FIBERS

(75) Inventor: Lisa A. Windover, San Francisco, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 261 days.

(21) Appl. No.: 10/394,840

(22) Filed: Mar. 21, 2003

(65) Prior Publication Data
US 2004/0184492 A1  Sep. 23, 2004

(51) Int. Cl.$^7$ .................................... H01S 3/13
(52) U.S. Cl. .................................... 372/31; 372/6
(58) Field of Search ............... 372/31–33, 30, 372/32, 45, 6–9, 50, 105–109, 29.01–29.023, 372/49, 107, 108

(56) References Cited

U.S. PATENT DOCUMENTS

| | | | | |
|---|---|---|---|---|
| 5,701,132 A * | 12/1997 | Kollin et al. | .................. | 345/8 |
| 5,838,715 A * | 11/1998 | Corzine et al. | ................ | 372/96 |
| 6,069,725 A * | 5/2000 | Melville | .................... | 359/212 |
| 6,157,352 A * | 12/2000 | Kollin et al. | .................. | 345/8 |
| 6,163,402 A | 12/2000 | Chou et al. | | |
| 6,328,482 B1 * | 12/2001 | Jian | ........................... | 385/88 |
| 6,329,661 B1 * | 12/2001 | Perov et al. | ............. | 250/461.2 |
| 6,434,309 B1 * | 8/2002 | Abbott et al. | ............... | 385/123 |
| 6,527,455 B2 * | 3/2003 | Jian | ........................... | 385/88 |
| 6,782,032 B2 * | 8/2004 | Kondow et al. | .............. | 372/92 |

* cited by examiner

*Primary Examiner*—Minsun Oh Harvey
*Assistant Examiner*—Tuan N. Nguyen

(57) ABSTRACT

A method and apparatus of using an input signal from a single-transverse mode vertical-cavity surface-emitting laser (VCSEL) with a multimode fiber (MMF) link to enable improved stabilization in time variation and improved modal dispersion of the output signal to facilitate the use of adaptive equalization techniques. The improvement results from using a conditioned launch of the input signal from the VCSEL into the MMF link. The increase in performance may be measured by the improved impulse response and an improved bandwidth-distance product of the MMF link.

17 Claims, 5 Drawing Sheets

METHOD AND APPARATUS TO ENABLE ADAPTIVE EQUALIZATION AT HIGH BANDWIDTHS WHEN USING SINGLE-MODE VCSELS OVER MULTIMODE FIBERS

BACKGROUND OF THE INVENTION

1. Field of the Invention

The present invention relates to a method and apparatus to improve the transmission of signals via optical fibers to achieve stabilization both in time variation and in dispersion to enable the improvement of the signals by means of adaptive equalization.

2. Discussion of the Related Art

Transmission of electronic signals via optical fibers has been incorporated in the electronics industry to overcome some of the disadvantages of copper (or other conductor) carriers. The use of fiber optics enables larger signal carrying capacity (bandwidth), is not subject to as much electrical interference, and requires less signal amplification compared with other signal carriers such as copper.

Single-mode lasers generate a very small wavelength range, which causes all of the light to travel down the fiber within a very small range of propagation times. Also, since a single-mode fiber only has one mode there is no modal dispersion. Compared with a multimode fiber, a single-mode fiber has higher bandwidth and can carry signals for longer distances due to the reduced signal dispersion. However, it is more expensive to manufacture fiber optic modules for single-mode fibers due, at least in part, to the tighter alignment requirements.

Multimode fibers (MMF) are large enough in diameter to allow low cost light sources such as light-emitting diodes (LEDs) and vertical-cavity surface-emitting lasers (VCSELs) to be coupled into the fiber with low cost assembly methods. However, when light beams from single-mode VCSELs are directly coupled into a MMF, the light rays travel through multiple path lengths (zigzag with varying numbers of bounces) through the MMF, causing signal or modal dispersion. This has limited the transmission distance of a multimode fiber compared to a single-mode fiber. For this reason, MMFs have generally been employed to transmit light signals from sources such as VCSELs only for short distances, typically less than 300 meters.

Modal dispersion may, in part, be compensated for with the use of adaptive equalization techniques on the fiber optic link at the receiver. Adaptive equalization is a known technique used in communication systems. Some examples of such adaptive equalization are described in the text book, E.A. Lee et al., Digital Communication, Kulwer Academic Publishers (1988). Adaptive equalization utilizes equalization that is adjusted while signals are being transmitted in order to adapt to changing line characteristics. Adaptive equalization introduces components to an analog or digital circuit to compensate for signal attenuation and delay distortion. If it is known what an output signal is supposed to be, the output received is filtered via electronics to subtract out the error, and electronic equalization adaptively changes the signal over a time period via feedback of a signal into a digital signal processor (DSP).

Generally, with higher transmission rates there is a greater need for equalization. Adaptive equalization techniques can be used to compensate for modal dispersion on a multimode fiber as long as the signal is not changing rapidly over time. However, during the fast transmission of digital signals on a dispersive communication channel, massive interference can occur on the receiver side, making it difficult to equalize a link that is changing rapidly with time, as occurs with use of multimode VCSELs and MMF combinations and may occur with the use of single-mode VCSELs and MMF combinations. Further, direct coupling of light signals into MMFs is subject to transmission distance limitations as mentioned above.

SUMMARY OF THE INVENTION

Broadly speaking, the present invention provides a method of using a single-transverse mode VCSEL to have a stable, conditioned launch of a light source data signal into a MMF to achieve time stabilization of the output data signal and improved signal dispersion. The result is longer distance signal transmission through MMFs and a signal that can be significantly improved using adaptive equalization techniques. This method can be achieved, according to the invention, by means of a VCSEL/launch/fiber combination that has an impulse response that changes slowly with time relative to the bit rate (time invariant on the time scale of interest) in order to allow implementation of adaptive equalization techniques to further compensate for modal dispersion due to the reduction of time variation.

The VCSEL output signal is conditioned by one of several possible means so that the output of the MMF transmission link into which the VCSEL signal is launched is sufficiently clean and stable to enable adaptive equalization to be applied to that MMF output. Examples of ways in which the launched signal from the VCSEL can be conditioned include using a diffractive optical element (DOE) to shape the optical signal entering the MMF, using an offset patchcord, or simply offsetting the VCSEL output port from the centerline of the MMF link.

BRIEF DESCRIPTION OF THE DRAWING

The objects, features and advantages of the invention will be more clearly perceived from the following detailed description, when read in conjunction with the accompanying drawing, in which.

DETAILED DESCRIPTION OF THE PREFERRED EMBODIMENTS

Figure 1:
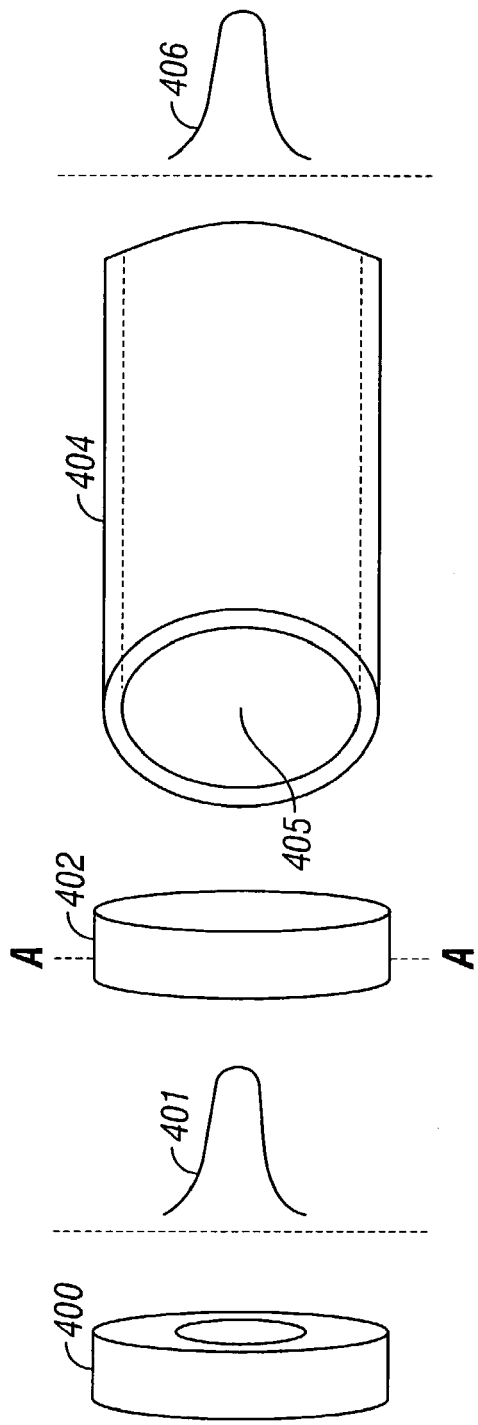
FIG. 1 is a perspective, schematic side view showing a preferred embodiment of the apparatus of the present invention employing a DOE to condition the input signal.

It is to be understood that the invention is not limited in its application to the details of the particular arrangement shown, since the invention is capable of other embodiments. Also, the terminology used herein is for the purpose of description and not of limitation.

The present invention utilizes the apparatus of a single-transverse mode VCSEL to have a stable launch of a light source data signal into a MMF to achieve an output data signal time stabilization and improved signal dispersion. The preferred embodiment of the invention employs a first launched light source data signal into a conditioning optical element such as an offset patchcord. The conditioning optical element is a connection block between the VCSEL and the multimode fiber. The conditioning optical element then transmits a conditioned light source data signal into a MMF thereby launching the signal into a restricted set of modes of the MMF, which acts to carry a stabilized and improved signal output. The use of a single-mode VCSEL in combination with the conditioning optical element improves the stability of the launch as compared to the use of a multimode VCSEL, or even a single-mode VCSEL without conditioning. MMFs are commonly found in present day installations and the present invention takes advantage of the installed base.

The present invention, as disclosed in some embodiments, provides an improved bandwidth-distance product as a result of employment of a single-transverse mode VCSEL and MMF combination with a conditioned launch, to enable effective use of adaptive equalization techniques, which is possible due to the more stable signal impulse response resulting from use of the invention.

The usual combination of a VCSEL with multiple transverse modes when launched into a MMF with loose alignment tolerances will result in an impulse response that may vary rapidly with time. This resulting impulse response will be due to variations in the spatial modal profile of the VCSEL itself and variations in coupling to the various modes of the MMF. In a severe case, the resulting impulse response may vary on a time scale similar to the bit rate, making it very difficult to implement adaptive equalization techniques as the equalization would need to adapt on a bit by bit time basis. The modal dispersion will result in severe receiver errors for some link lengths. The effective bandwidth-distance product is thereby reduced in comparison with the result when using the present invention.

The present invention utilizes the apparatus of a single-transverse mode VCSEL to initiate a stable conditioned launch of an initial light source data signal into a MMF resulting in the achievement of an output data signal having time stabilization and improved signal dispersion. This unique combination of a single-transverse mode VCSEL used to perform a stable launch of a laser light signal into a MMF resulting in stabilization of the light signal allows the effective use of adaptive equalization techniques on the output data signal.

The present invention further uses the single-transverse mode VCSEL to launch a signal into a MMF in a conditioned manner to further improve time stabilization and signal dispersion. This conditioned launch is obtained by restricting the set of modes that are launched into the MMF. A conditioned launch can be obtained by any of the several methods hereinafter listed.

(1) One exemplary embodiment of the present invention utilizes a diffractive optical element (DOE) placed between a single-mode VCSEL and the MMF. This DOE functions to transform the incoming light from the single-mode VCSEL into a specific shaped (for example, a doughnut shape or some other uniform shape) light signal that launches into the MMF such that it excites a restricted set of modes in the MMF.

(2) Another exemplary embodiment uses an offset patchcord placed between the single-mode VCSEL and the MMF. The patchcord consists of a SMF and a MMF piece. The VCSEL is aligned into the SMF input portion of the offset patchcord, the SMF is, in turn, coupled with a fixed offset from the center of the core of the MMF portion of the offset patchcord, and then the MMF output of the offset patchcord is connected to the desired MMF link.

(3) Another exemplary embodiment directly offsets a VCSEL into a MMF via alignment, thereby not using an offset patchcord.

In the preferred embodiment of the present invention, a single-transverse mode VCSEL is used to convert an initial output light source data signal into a conditioned launch, using one of the above techniques for achieving the desired conditioning. The conditioned launch functions to condition the output light source data signal from the VCSEL into a light core (MMF) so that a more stable and restricted set of modes are excited in the fiber. The conditioned launch restricts the set of modes that are excited in the fiber and results in reduced modal dispersion. When used in conjunction with a single-mode VCSEL, the conditioned launch results in a very time-stable optical pulse. The result of this method of using the VCSEL and conditioned launch MMF combination results in a greatly improved stabilization of the impulse response of the fiber over time. The resulting optical output light source data signal from the MMF has reduced dispersion when compared to the optical output of a standard multimode VCSEL launched into a MMF with no attempt to condition the launch. This results in an output that is more stable with time and has less dispersion due to the launch into a restricted set of MMF modes. As a result, the impulse response of the MMF will change on a slow time scale relative to the bit rate. Thus the impulse response will be time invariant on the time scale of interest.

This slow time scale change will enable adaptive equalization techniques to now be applied to the fiber optic link. Thus, the MMF output signal can be converted into an electronic output signal and adaptive equalization techniques can be applied to this signal to result in an output electronic signal that is compensated for modal dispersion. The ability to apply adaptive equalization techniques is a direct result of the reduction of time variation is a result of using a single-transverse mode VCSEL, conditioned launch, and MMF combination.

The output pulses as a result of the techniques of the present invention result in improved dispersion when compared to the prior art methods.

The main benefit of the present invention is an improved bandwidth-distance product as a result of employment of the single-transverse mode VCSEL, MMF combination, conditioned launch, and adaptive equalization techniques. A higher bandwidth-distance product allows sending a faster signal over the same distance or increasing a distance for a set signal bandwidth. An improvement of about ten-fold or more, when compared to prior art, is expected with the use of the apparatus and method of the present invention. Yet another benefit of the present invention is that it takes advantage of the existing fiber optic installation base, which commonly has MMF installed.

Referring now to the drawing, FIG. 1 shows a preferred embodiment of the apparatus of the present invention, along with input and output light intensities. Single-transverse mode VCSEL 400 launches optical input 401 which is conditioned by diffractive optical element (DOE) 402 placed between the VCSEL and multimode fiber (MMF) 404. DOE 402 conditions optical input 401 by transforming it into a specific shape (for example, a doughnut shape or other uniform shape) that launches into center core or channel 405 of MMF 404 such that it would excite a restricted set of modes in the MMF. The controlled launch condition provided by the DOE, and the restricted set of modes in MMF 404, results in a very time-stable optical output 406. The resulting optical output 406, as it exits core 405, has very little dispersion as compared to optical input 401, as well as being time stable. The use of a single-transverse mode VCSEL with DOE 402 thus provides a much more stable optical output as it exits from MMF 404 as compared to the use of a multi-transverse mode VCSEL launched into a MMF. As stated above, this allows use of adaptive equalization techniques (not part of this invention) to further improve the output signal.

Figure 2A:
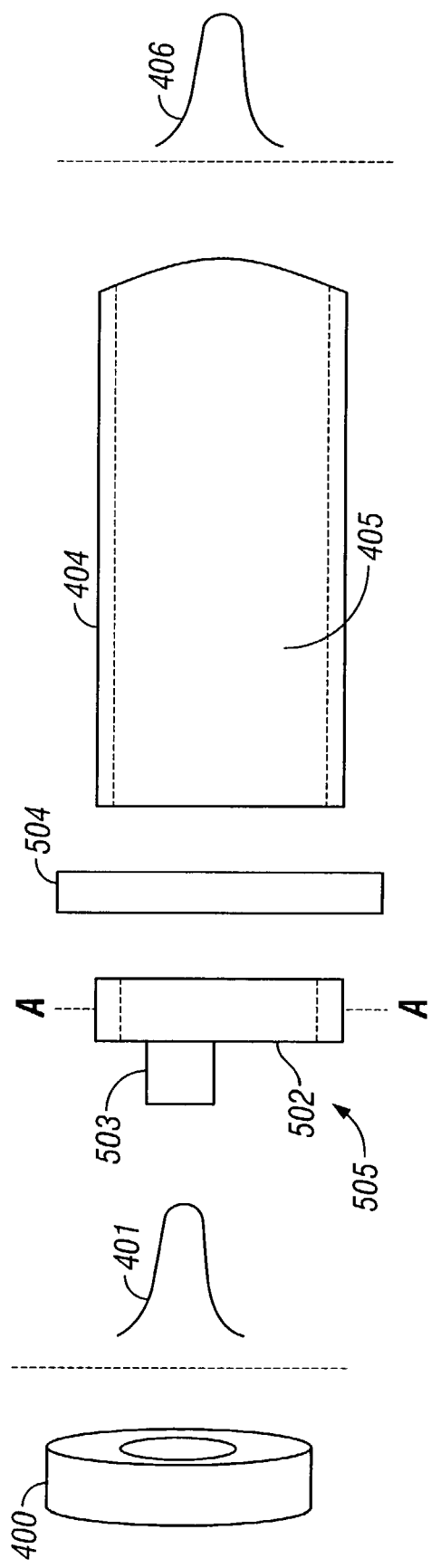
FIG. 2A is a side view similar to FIG. 1, showing a conditioned launch apparatus using an offset patchcord.

FIG. 2A is similar to FIG. 1 with the exception that offset patchcord 505 replaces DOE 402. The offset patchcord consists of single-mode fiber (SMF) element 503 and MMF element 502. Offset patchcord 505 conditions the launch of optical input 401 from single-transverse mode VCSEL 400 into channel 405 of MMF link 404, enabling further improvement in the stability of the optical output as it exits the MMF link. As with the FIG. 1 embodiment, the controlled launch thereby excites a restricted set of optical modes of MMF fiber core 405. The offset patchcord creates a launch that restricts the set of modes that are excited in MMF 404 and results in a very time-stable optical output 406. The conditioned launch sent through center core 405 of multimode fiber 404 results in optical output 406 that has very little dispersion as compared to optical input 401. This allows the use of adaptive equalization techniques, as previously discussed, which further improve the quality of the output signal from the MMF link.

Figure 2B:
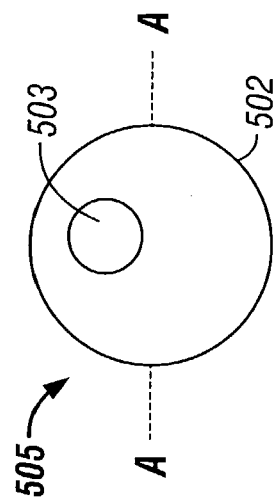
FIG. 2B is a front view of the offset patchcord of FIG. 2A.

FIG. 2B is a front view of offset patchcord 505 showing SMF element 503 and MMF element 502. Referring to FIG. 2A, VCSEL 400 is aligned with SMF 503 whereas MMF element 502 is coupled to and aligned with MMF 404 with connecting collar 504.

Figure 3:
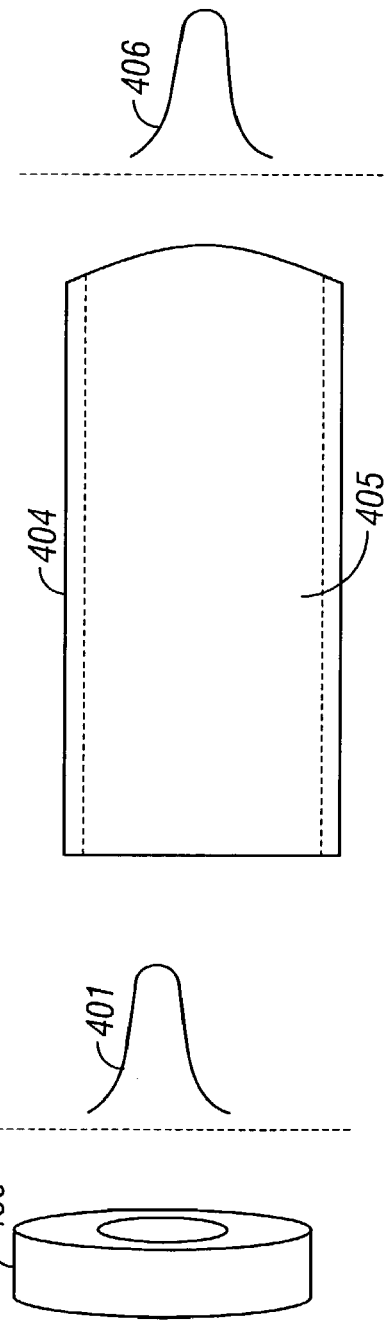
FIG. 3 is a side view similar to FIG. 1, showing a VCSEL offset into a MMF via alignment for conditioning of the launch signal.

FIG. 3 is a side view showing VCSEL 400 offset with respect to the centerline of MMF 404. This use of directly offsetting VCSEL 400 into MMF 404 does not use an optical element nor an offset patchcord. The result, however, is to excite a restricted set of modes of MMF 404 with resulting optical output 406 having time stabilization and low dispersion, to enable the application of adaptive equalization techniques.

Figure 4A:
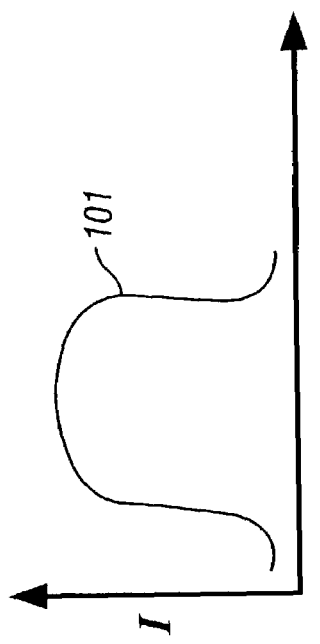
FIG. 4A depicts a typical light pulse signal launched from a multimode VCSEL.

FIG. 4A depicts light pulse data signal 100 launched from a multimode VCSEL. Typical VCSEL output pulses are below 100 picoseconds and normally about 50 picoseconds in duration when using the VCSEL to measure the impulse response of a fiber. The waveform shown is signal amplitude or intensity, I, versus time t.

Figure 4B:
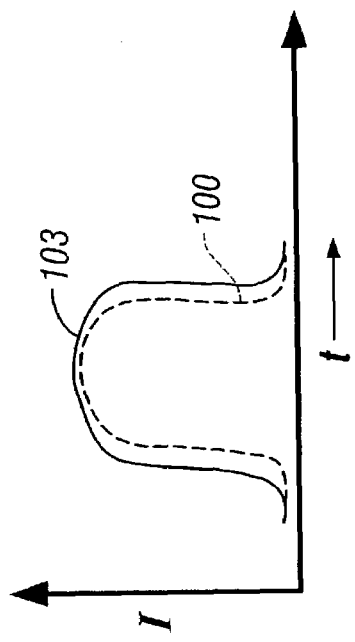
FIG. 4B shows an output light pulse signal from a multimode VCSEL after transmission through a multimode fiber with typical dispersion, in accordance with the prior art.

FIG. 4B depicts the results of the prior art, showing a typical output light pulse data signal 101 after transmission through a MMF with a multimode VCSEL launch. It can be seen how time dispersion widens output optical data signal 101 when using a multimode VCSEL into a MMF link. As can be seen, assuming the same time scale as FIG. 4A, multimode VCSEL output data signal 101 is substantially longer in duration than is VCSEL input signal 100, primarily due to time dispersion.

Figure 4C:
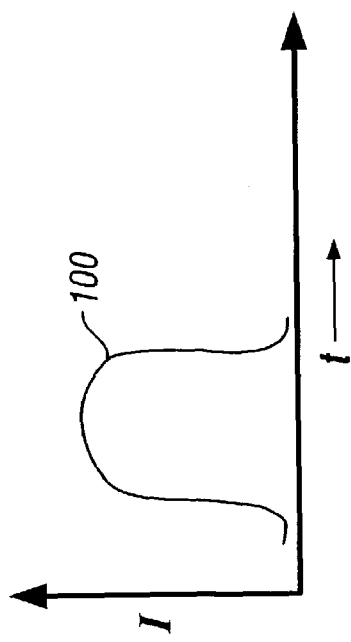
FIG. 4C depicts an alternative prior art output light pulse signal from a multimode VCSEL after transmission through a multimode fiber showing bimodal dispersion.

FIG. 4C depicts another example of the prior art output light pulse data signal 102 using a MMF with a multimode VCSEL. The output light pulse data signal 102 may have severe dispersion that can, at times, be very erratic and bimodal in nature. The FIGS. 4B and 4C waveforms are different because of the lack of stability of the input signal, so the output can vary greatly.

Figure 4D:
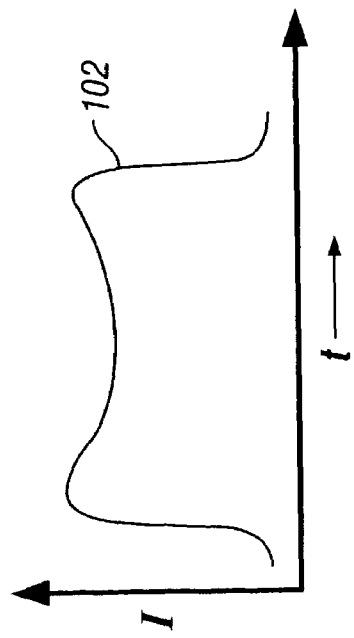
FIG. 4D shows an output light pulse signal from a single-mode VCSEL after transmission through a multimode fiber and employing the present invention.

FIG. 4D depicts the result when using the method and apparatus of the present invention showing the output light pulse data signal 103 after transmission through a MMF with a single-transverse mode VCSEL conditioned signal input. As can be seen, the dispersion of output light pulse data signal 103 is only slightly larger compared to the input data signal 100 (dotted line), as evidence of the effectiveness of the invention. This output signal 103 is now available to be improved with adaptive equalization techniques.

Figure 5A:
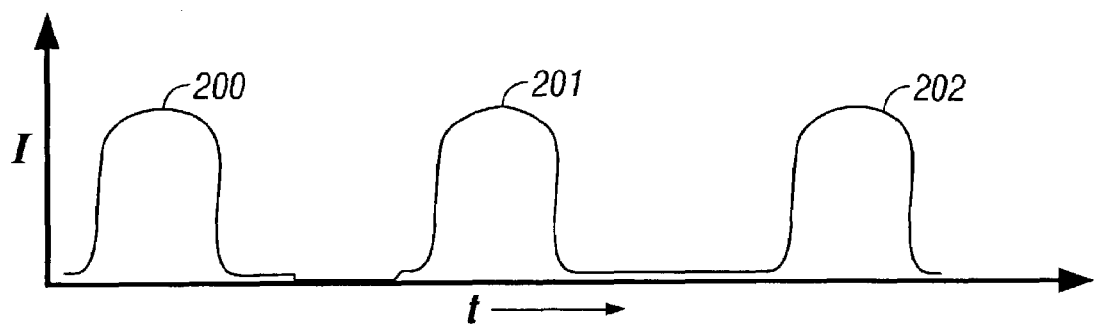
FIG. 5A depicts a typical series of light pulses launched from a VCSEL.

FIG. 5A depicts a series of input data signal light pulses 200, 201, 202 launched from a VCSEL. As with FIG. 4, pulse widths are normally less than 100 picoseconds, typically about 50 picoseconds for measurement purposes.

Figure 5B:
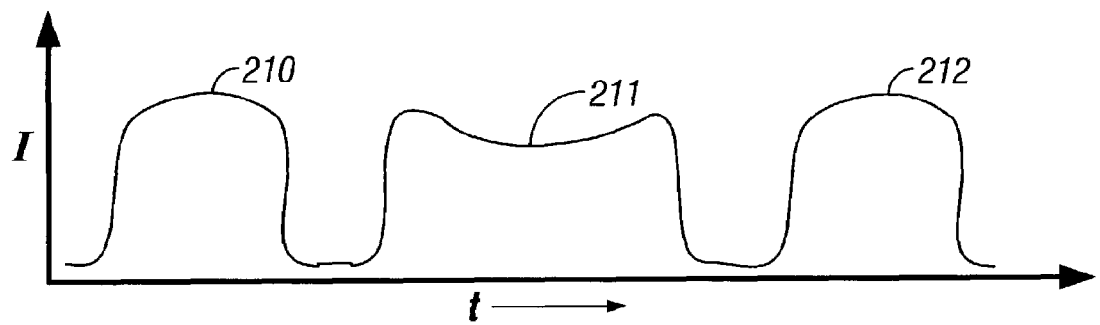
FIG. 5B depicts a series of output light pulse signals from a multimode VCSEL after passing through a MMF link using the prior art.

FIG. 5B depicts a series of output data signal light pulse signals 210, 211, 212 using the prior art of launching a light source signal with a multimode VCSEL into a MMF. Input data signals 200, 202 (FIG. 5A), when launched from a multimode VCSEL, are received from the MMF as data signal light pulse signals 210, 212 having a relatively large dispersion. Input data signal 201 is shown received as bimodal data signal 211 with an even more severe dispersion.

Figure 5C:
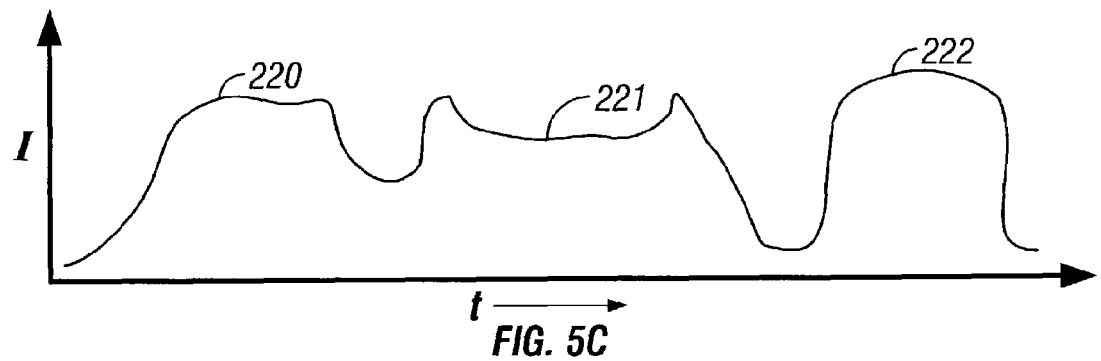
FIG. 5C is similar to FIG. 5B, depicting a series of output light pulse signals with a more severe dispersion using the prior art.

FIG. 5C is similar to FIG. 5B, depicting a series of output light pulse data signals 220, 221, 222, using the prior art of launching from a multimode VCSEL into a MMF but showing an even more severe dispersion. Output source data signals 220, 221, 222 are depicted such that input source data signals 200 and 201 are shown as greatly overlapped outputs 220, 221 due to the severe dispersion. Both FIGS. 5B and 5C depict the outcome of using a multimode VCSEL with a MMF.

Figure 5D:
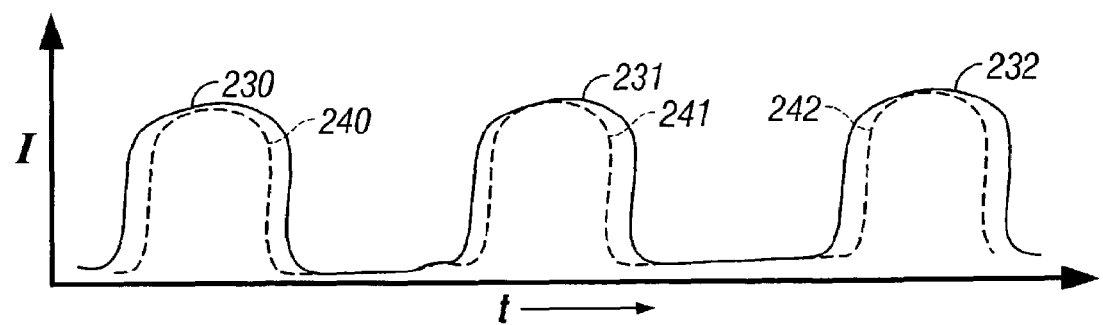
FIG. 5D shows a series of output light pulse signals from a single-mode VCSEL after transmission through a MMF, using the method and apparatus of the present invention.

As with FIG. 4D, FIG. 5D depicts a series of output light pulse data signals 230, 231, 232, using the method and apparatus of the present invention. Input source data signals 200, 201, 202 (see FIG. 5A), when launched from a single-transverse mode VCSEL, conditioned as taught herein, into a MMF, are received as light pulse data signals 230, 231, 232 with less dispersion and with less variation from pulse to pulse. Received data signals 240, 241, 242 are shown "after" adaptive equalization and are very similar to input source data signals 200, 201, 202. As previously described, the invention allows for adaptive equalization techniques to be used on output signals 230, 231, 232, which also improves the bandwidth-distance product.

Figure 6A:
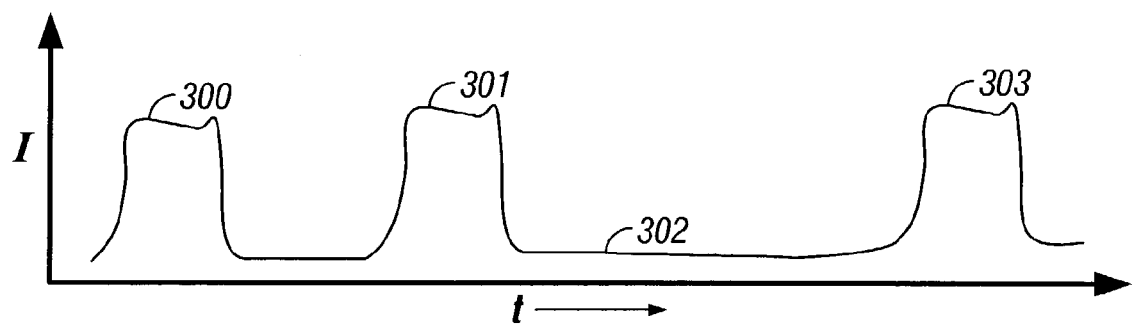
FIG. 6A depicts a typical logical digital optical sequence of "1101" data pulse signals using a return-to-zero encoding method.
Figure 6B:
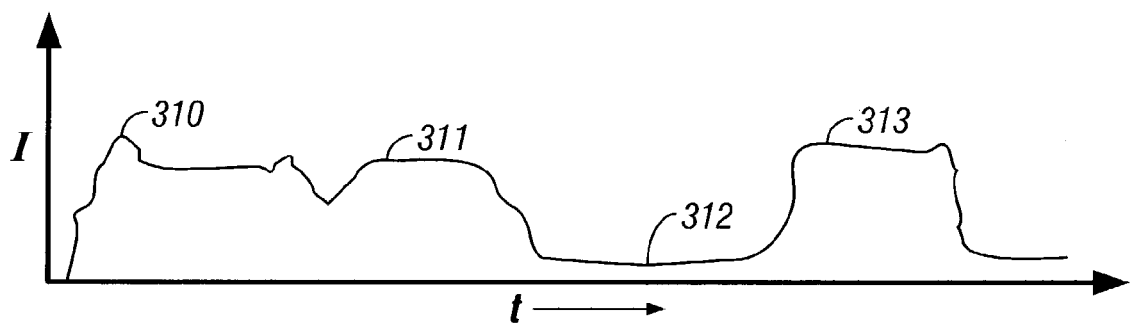
FIG. 6B depicts a series of output digital optical data pulse signals from a MMF using the prior art.

FIG. 6A depicts a logical sequence of binary logic levels "1101" as respective input light data pulse signals 300, 301, 302, 303. The logical sequence "1101" is shown by the first logical pulse "1" as data signal 300, the second logical "1" pulse is data signal 301, the third logical pulse "0" is data signal 302, and the fourth logical pulse "1" is data signal 303. As in the prior art, when launched by a multimode VCSEL into a MMF, the signal dispersion may be severe enough to create errors at the receiver. FIG. 6B shows such a severe dispersion, where first logical pulse 300 and second logical pulse 301 (FIG. 6A) are severely dispersed when output as first and second logical output data signals 310 and 311. As can be seen, the dispersion at the receiving end results in overlap of received data signals 310, 311 such that the original input signals of first and second logical "1" data signals 300 and 301 may not be correctly read at the receiver, resulting in an error. Such errors greatly reduce the effective bandwidth and thus the performance, and make adaptive equalization very difficult, if it is possible at all.

Figure 6C:
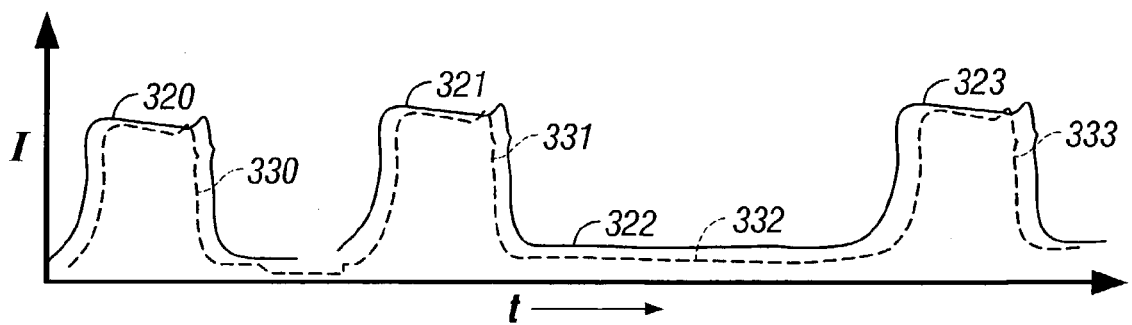
FIG. 6C shows a series of output digital optical pulse data signals from a MMF using the method and apparatus of the present invention.

FIG. 6C depicts a series of output light pulse data signals 320, 321, 322, 323 using the method and apparatus of the present invention whereby input light source signals are launched from a single-transverse mode VCSEL, conditioned, and passed into a MMF. As can be seen, the output data signals 320, 321, 322, 323 are very similar to the original output data signals 300, 301, 302, 303 (FIG. 6A) with less dispersion. Output data signals 330, 331, 332, 333 are shown "after" adaptive equalization has been applied and are almost exact replicas of input pulses 300, 301, 302, 303. The method and apparatus of the present invention results in less dispersion and stabilization with time, thus allowing the use of adaptive equalization techniques on pulses 320, 321, 322, 323, resulting in an improved bandwidth-distance product.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. An apparatus for improving optical signal characteristics, the apparatus comprising:
   a single-transverse mode vertical-cavity surface-emitting laser (VCSEL) having an emitting aperture;
   a multimode fiber (MMF) link having an input end and an output end; and
   signal conditioning means coupled between said VCSEL emitting aperture and said input end of said MMF, said signal conditioning means effectively time stabilizing and modal dispersion controlling the optical characteristics of the output optical signal from the output end of said MMF link to enable adaptive equalization techniques to be applied to the output signal to improve the bandwidth of the output signal.

2. The apparatus recited in claim 1, wherein said signal conditioning means comprises a diffractive optical element (DOE).

3. The apparatus recited in claim 1, wherein said signal conditioning means comprises an offset patchcord.

4. The apparatus recited in claim 3, wherein said offset patchcord comprises a single-mode fiber element and a MMF element coupled together with a fixed offset between the two core centers.

5. The apparatus recited in claim 1, wherein said signal conditioning means comprises axially offsetting said VCSEL emitting aperture from the axis of said MMF link.

6. A method for improving optical signal characteristics, the method comprising:
   emitting a signal from a single-transverse mode vertical-cavity surface-emitting laser (VCSEL);
   conditioning the emitted signal; and
   passing the conditioned signal through a multimode fiber (MMF) link to provide an output optical signal which is sufficiently time stabilized and modal dispersion controlled to enable adaptive equalization techniques to be applied to the output signal to improve the bandwidth of the output signal.

7. The method recited in claim 6, wherein said conditioning is accomplished by a diffractive optical element (DOE) coupled between the VCSEL and the MMF.

8. The method recited in claim 6, wherein said conditioning is accomplished by an offset patchcord coupled between the VCSEL and the MMF.

9. The method recited in claim 8, wherein the offset patchcord comprises a single-mode fiber element (SMF) aligned with the signal emitted from the VCSEL and a MMF element aligned with the MMF link, the SMF and the MMF of the patchcord being axially misaligned.

10. The method recited in claim 6, wherein said conditioning is accomplished by coupling the signal emitted from the VCSEL in an axially misaligned manner to the MMF link.

11. The method recited in claim 6, wherein the conditioned emitted signal excites a restricted set of modes in the MMF link.

12. An apparatus for improving optical signal characteristics, the apparatus comprising:
   means for providing a single-transverse mode optical input signal;
   multimode fiber (MMF) link means having an input and an output; and
   signal conditioning means coupled between said signal providing means and said MMF input, said signal conditioning means providing effective time stabilization and modal dispersion control to the output optical signal from the output of said MMF to enable improvement of the bandwidth of the output optical signal by means of adaptive equalization techniques.

13. The apparatus recited in claim 12, wherein said signal providing means is a single-transverse mode vertical-cavity surface-emitting laser (VCSEL).

14. The apparatus recited in claim 12, wherein said signal conditioning means comprises a diffractive optical element (DOE).

15. The apparatus recited in claim 12, wherein said signal conditioning means comprises an offset patchcord.

16. The apparatus recited in claim 12, wherein said offset patchcord comprises a single-mode fiber element and a MMF element axially misaligned.

17. The apparatus recited in claim 12, wherein said signal conditioning means comprises axially offsetting said VCSEL emitting aperture from the axis of said MMF link.

* * * * *